United States Patent
Ohtani et al.

(10) Patent No.: US 6,819,570 B2
(45) Date of Patent: Nov. 16, 2004

(54) CIRCUIT BOARD WITH LEAD FRAME

(75) Inventors: Hideyuki Ohtani, Aichi-gun (JP); Mutuo Taniguchi, Kariya (JP)

(73) Assignee: Anden Co., Ltd., Aichi-ken (JP)

( * ) Notice: Subject to any disclaimer, the term of this patent is extended or adjusted under 35 U.S.C. 154(b) by 0 days.

(21) Appl. No.: 10/359,059

(22) Filed: Feb. 6, 2003

(65) Prior Publication Data

US 2003/0174477 A1 Sep. 18, 2003

(30) Foreign Application Priority Data

Feb. 7, 2002 (JP) ........................................ 2002-030927

(51) Int. Cl.$^7$ ................................................ H01R 9/00
(52) U.S. Cl. ........................ 361/776; 361/774; 361/813; 174/257; 174/258; 174/260; 257/787; 257/780
(58) Field of Search ................................ 361/776, 774, 361/772, 807, 813, 723; 174/52.2, 257–258, 260, 267; 257/789–790, 787–788; 439/951

(56) References Cited

U.S. PATENT DOCUMENTS 5,792,984 A * 8/1998 Bloom ....................... 174/52.3
6,420,664 B1 * 7/2002 Muramatsu et al. ........ 174/262

* cited by examiner

*Primary Examiner*—Kamand Cuneo
*Assistant Examiner*—Hung S. Bui
(74) *Attorney, Agent, or Firm*—Posz & Bethards, PLC

(57) ABSTRACT

In a circuit board of the present invention, a lead frame includes an electrode for mounting an electronic component. The lead frame is encapsulated in a resin portion. The lead frame includes a step portion exposed from a surface of the resin portion so that the electrode is formed. Accordingly, not only lead type electronic components but also surface mount type electronic components can be mounted on the surface of the circuit board. Therefore, because the electronic components can be concentrated, the lead frame circuit board can be miniaturized.

15 Claims, 4 Drawing Sheets

CIRCUIT BOARD WITH LEAD FRAME

CROSS REFERENCE TO RELATED APPLICATION

This application is based upon and claims the benefit of Japanese Patent Application No. 2002-30927 filed on Feb. 7, 2002, the contents of which are incorporated herein by reference.

FIELD OF THE INVENTION

The present invention relates to circuit boards with a lead frame that conducts current and radiates heat generated from an electronic component or components.

BACKGROUND OF THE INVENTION

Conventionally, SMD (Surface Mount Device) mounting, i.e., surface mounting, is used for electrically connecting surface electronic components to a printed circuit board in order to increase the density of the surface electronic components on the printed circuit board. However, since SMD mounting is not good for radiating heat from the printed circuit board, it is necessary to attach a cooling fin to the printed circuit board when a power element from which a large quantity of heat is generated is mounted. Therefore, SMD mounting increases cost, and the size of the printed circuit board increases. Further, the SMD mounting requires connector terminals attached to the printed circuit board for electrically connecting external terminals (not shown) so that manufacturing processes thereof increase.

Lead frames are also utilized for mounting. FIG. 8 is a side view showing a lead frame circuit board J10 in which lead frames J11 are molded in resin J12. Lead type electronic components J20–J22 are typically mounted on the lead frame circuit board J10. However, in the lead frame circuit board J10, electrodes J11a on which the lead type electronic components J20–J22 are mounted are disposed inside of a surface of the lead frame circuit board J10. Accordingly, surface mount type electronic components cannot be mounted on the electrodes J11a. That is, an approximately flat surface is required for print solder paste so that solder paste cannot be printed on the surface of the lead frame circuit board J10 having the concave electrodes J11a. Further, small size surface mount type electronic components such as resistors, capacitors and transistors cannot also be mounted on the concave electrodes J11a because leads thereof do not extend outside and are typically too short to be bonded with the electrodes J11a. As a result, because electronic components cannot be concentrated on the lead frame circuit board, the lead frame circuit board cannot be miniaturized.

SUMMARY OF THE INVENTION

It is therefore an object of the present invention to provide a circuit board that is capable of obviating the above problems.

It is another object of the present invention to provide a circuit board that is capable of being miniaturized.

It is further object of the present invention to provide a circuit board that is capable of radiating heat.

According to a circuit board of the present invention, a lead frame includes an electrode for mounting an electronic component. A resin portion encapsulates the lead frame. The lead frame includes a step portion exposed from a surface of the resin portion so that the electrode is formed.

Accordingly, not only lead type electronic components but also the surface mount type electronic components can be mounted on the surface of the circuit board. Therefore, because the electronic components can be concentrated, the circuit board can be miniaturized.

According to another aspect of the present invention, the electrode is approximately coplanar with the surface of the resin portion. Therefore, solder paste or the like, which is used for electrically connecting the surface mount type electronic components to the electrode, can be printed on the surface of the circuit board.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1:
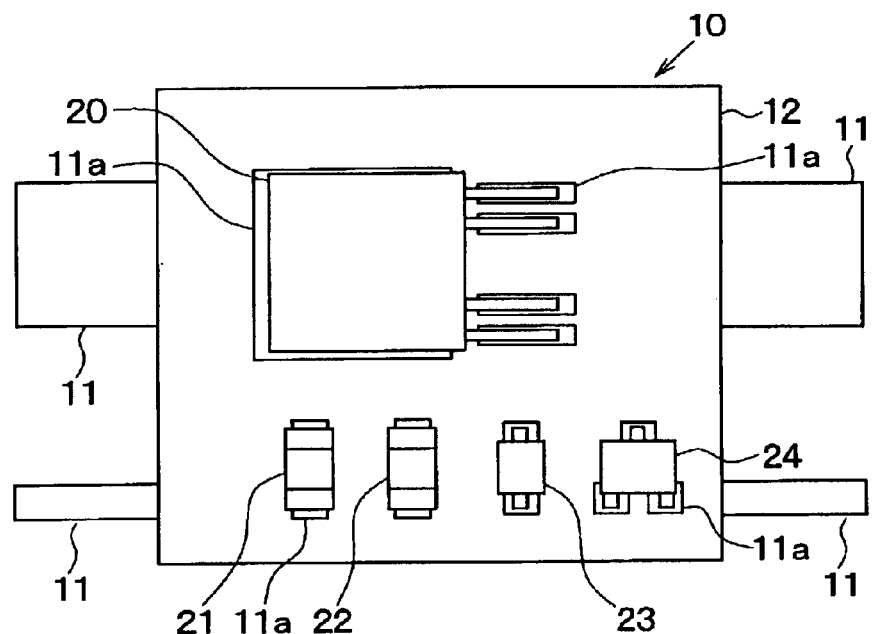
FIG. 1 is a plan view showing a lead frame circuit board on which electronic components are mounted according to a first embodiment of the present invention.

The present invention will be described further with reference to various embodiments shown in the drawings.

First Embodiment

A first embodiment of the present invention is described with reference to FIGS. 1–3. FIG. 1 is a plan view showing a lead frame circuit board 10 on which electronic components 20–24 corresponding to surface mount type electronic components are mounted. A power element 20, a resistor 21, a capacitor 22, a diode 23 and a transistor 24 are mounted on a surface of the lead frame circuit board 10. The power element 20 is an element such as a power transistor, a power diode or an IGBT for conducting a large amount of current.

Figure 2:
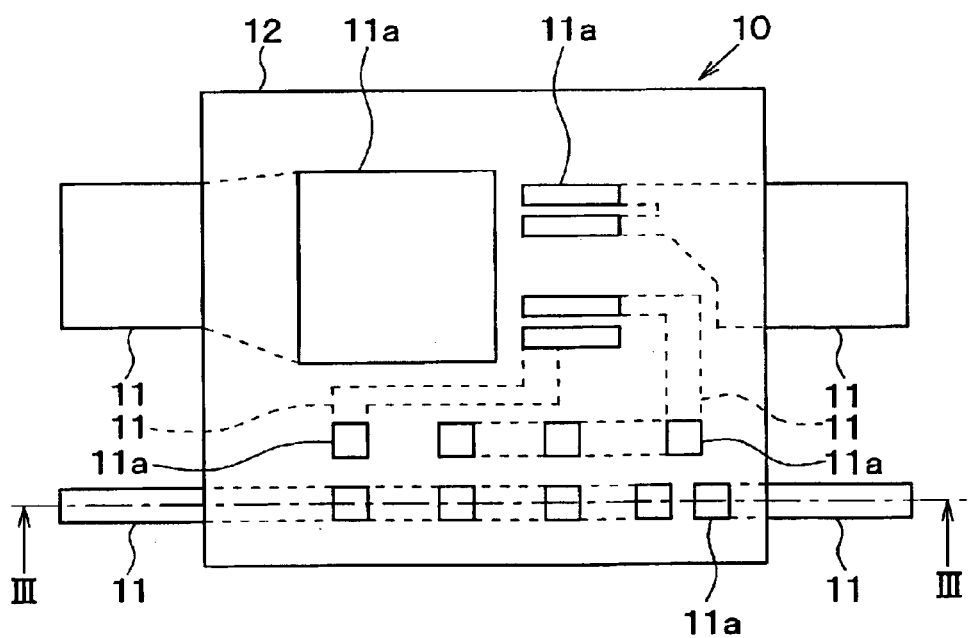
FIG. 2 is a plan view showing the lead frame circuit board without the electronic components according to the first embodiment.

FIG. 2 is a plan view showing the lead frame circuit board 10 without the electronic components 20–24. FIG. 3 is a cross sectional view of the lead frame circuit board taken along line III—III of FIG. 2.

As shown in FIG. 2, the lead frame circuit board 10 includes lead frames 11 for configuring an electric circuit pattern and molded resin 12 for encapsulating the lead frames 11 and forming a board shape. The lead frames 11 are, for example, formed of copper family metal such as copper and brass. The molded resin 12 is, for example, formed of heat resisting resin such as PPS. The lead frame circuit board 10 is manufactured by insert-molding or outsert-molding the lead frames 11 with the molded resin 12.

Respective lead frames 11 includes at least one electrode (land) 11a on which the electronic components 20–22 are mounted. The lead frames 11 are electrically isolated from each other through the molded resin 12 and can supply different electric potentials. Therefore, respective electrodes 11a formed on different lead frames 11 are electrically isolated from each other.

Figure 3:
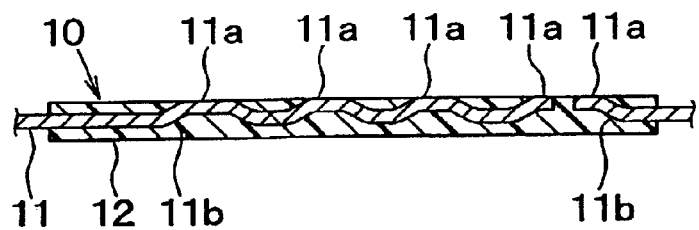
FIG. 3 is a cross sectional view of the lead frame circuit board taken along line III—III of FIG. 2.

As shown in FIG. 3, the lead frames 11 are repeatedly bent in the molded resin 12 so that step portions 11b are formed. The electrodes 11a are formed by the step portions 11b because predetermined portions of the lead frames 11 are exposed through the surface of the molded resin 12. The electrodes 11a protrude a predetermined distance corresponding to a thickness of the molded resin 12 on a side of the surface thereof from other portions of the lead frames 11 so that the electrodes 11a are approximately coplanar with the surface of the molded resin 12.

As mentioned above, in the lead frame circuit board 10 of the present embodiment, the step portions 11b are formed in the lead frames 11, and the electrodes 11a are approximately coplanar with the surface of the molded resin 12. Therefore, solder paste, which is used for electrically connecting the surface mount type electronic components to the electrodes 11a, can be printed on the surface of the lead frame circuit board 10. As a result, because not only lead type electronic components but also the surface mount type electronic components can be mounted on the surface of the lead frame circuit board 10, the electronic components can be concentrated and the lead frame circuit board 10 can be miniaturized.

The lead frame circuit board 10 can be handled as a normal printed circuit board because it is flat. Therefore, facilities used for surface mounting processes of normal printed circuit boards, e.g., a solder paste printing machine, can be utilized for manufacturing the lead frame circuit board 10 so that additional facilities are not required.

The lead frames 11 have a thickness, for example, of 400 $\mu$m. The thickness of the lead frames 11 is sufficiently thicker than that of electrodes (35–70 $\mu$m) normally printed on the printed circuit board. Therefore, the lead frames 11 themselves act as heat radiators. That is, heat generated from the electronic components 20–24 radiates outside of the lead frame circuit board 10 via the electrodes 11a and the lead frames 11. The lead frame circuit board 10 thus has heat radiating capabilities. Accordingly, a cooling fin that is required in a conventional printed circuit board can be omitted or the capacity of the cooling fin can be decreased even if the power element 20 from which large amount of heat is radiated is mounted on the lead frame circuit board 10. The cost associated with the lead frame circuit board 10 correspondingly decreases.

Figure 4:
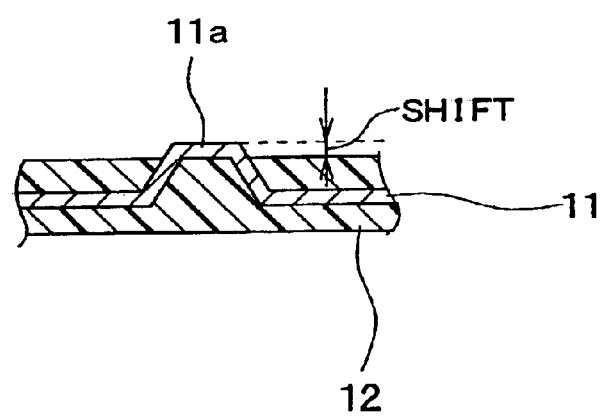
FIG. 4 is a cross sectional view of the lead frame circuit board showing a permissible range of portions of electrodes shifting from a surface of molded resin according to the first embodiment.

In the present embodiment, the electrodes 11a are approximately coplanar with the surface of the molded resin 12. This indicates that the electrodes 11a may shift from the surface of the molded resin 12 as illustrated in FIG. 4. In other words, as long as solder paste can be printed on the electrodes 11a and the surface mount type electronic components 20–24 can be mounted on the electrodes 11a, the electrodes 11a can protrude from the surface of the molded resin 12.

Modifications

Figure 5:
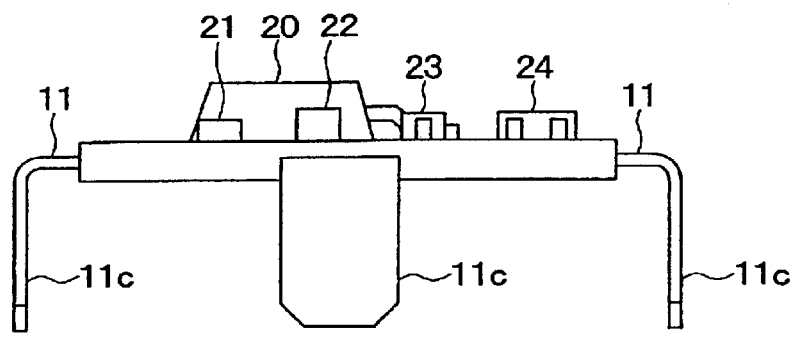
FIG. 5 is a side view showing a lead frame circuit board according to a modification of the present invention.

In the above embodiment, as shown in FIG. 5, the lead frames 11 can be bent to form terminals 11c for connecting external terminals (not shown). Accordingly, terminals for connecting the external terminals are not required in addition to the lead frames 11. Therefore, because parts of the lead frame circuit board 10 and the number manufacturing steps thereof decrease, cost for the lead frame circuit board 10 decreases.

Figure 6:
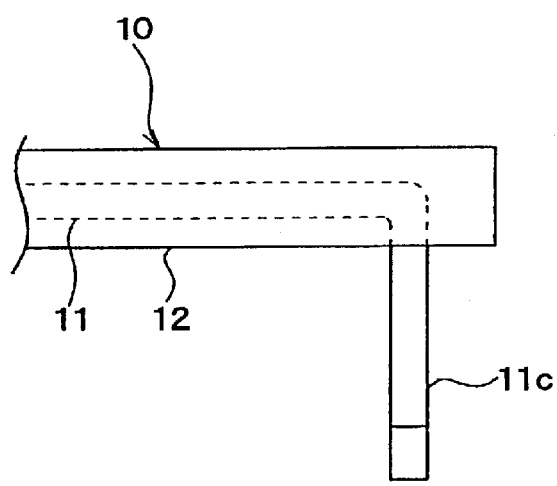
FIG. 6 is a side view showing a lead frame circuit board according to a modification of the present invention.

Bent portions of the lead frames 11 are not limited to being located at an outside of the resin portion 12 as illustrated in FIG. 5. For example, as shown in FIG. 6, the lead frames 11 may alternatively be bent at an inside of the resin portion 12 to form the terminals 11c for connecting external terminals (not shown) Incidentally, FIGS. 5 and 6 show examples that the lead frames 11 are bent in a direction opposite to the surface of the lead frame circuit board 10 on which the electronic components 20–24 are mounted. However, the lead frames 11 may alternatively be bent in a direction to which the surface of the lead frame circuit board 10 is located so as to form the terminals 11c for connecting external terminals (not shown).

Figure 7:
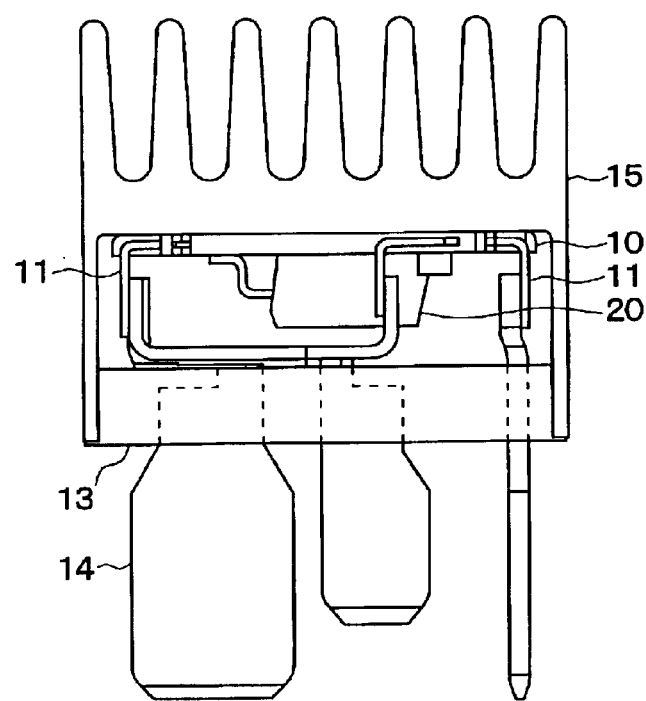
FIG. 7 is a side view showing a lead frame circuit board according to a modification of the present invention.
Figure 8:
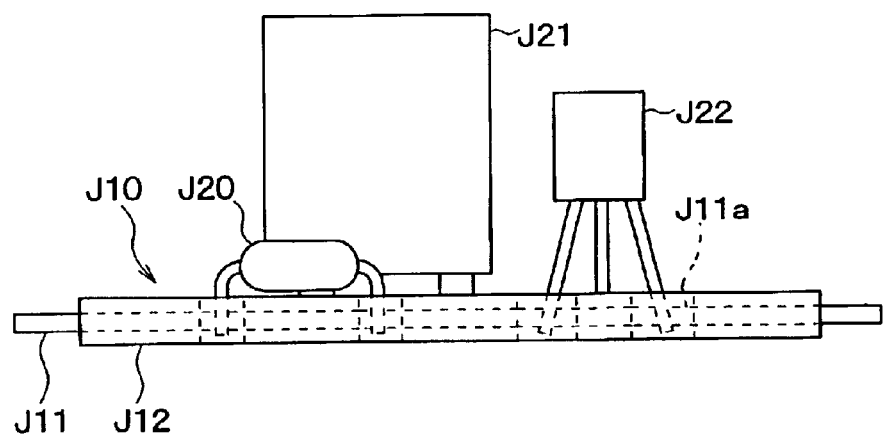
FIG. 8 is a side view showing a lead frame circuit board on which electronic components are mounted according to a related art circuit board.

Further, as shown in FIG. 7, the lead frame circuit board 10 may alternatively be attached to a case 13 having terminals 14 for connecting the external terminals (not shown). In addition, a cooling fin 15 can alternatively be attached to a reverse surface of the lead frame circuit board 10. In this case, each of the terminals 14 and each end of the lead frames 11 are connected by, for example, welding so that the lead frame circuit board 10 is fixed on the case 13. The cooling fin 15 is fixed on the case 13 through an adhesive or by pressured insertion. The cooling fin 15 is also fixed on the lead frame circuit board 10 through an adhesive or the like. On the reverse side of the lead frame circuit board 10, the molded resin 12 has a hole penetrating to one of the lead frames 11 on which the power element 21 is mounted. A protruding portion provided in the cooling fin 15 is inserted into the hole of the molded resin 12 to contact the one of the lead frames 11.

According to the lead frame circuit board 10 illustrated in FIG. 7, the heat generated from the power element 20 travels to the cooling fin 15 through the one of the lead frames 11. Therefore, heat radiation efficiency of the lead frame circuit board 10 increases.

If the lead frame circuit board 10 and the cooling fin 15 are electrically isolated from each other, an attaching portion therebetween may alternatively be formed as an isolation material having good heat conductance. For example, the lead frame circuit board 10 and the cooling fin 15 can be fixed through a cooling seat, a insulating film, an insulating adhesive or the like.

In the above embodiment, the electrodes 11a are formed by bending the lead frames 11 to expose a part of the lead frames 11 from the surface of the resin portion 12. However, the electrodes 11a can alternatively be formed by protrusion portions formed on or integrated with the lead frames 11 that are exposed from the surface of the resin portion 12.

While the above description is of the preferred embodiments of the present invention, it should be appreciated that the invention may be modified, altered, or varied without deviating from the scope and fair meaning of the following claims.

What is claimed is:

1. A circuit board comprising:
   a lead frame including an electrode for mounting an electronic component and a connector terminal for connecting to an external terminal; and
   a resin portion in which the lead frame is encapsulated;
   wherein the lead frame includes a step portion being exposed through a surface of the resin portion, the electrode being formed by a portion of the step portion exposed through the surface of the resin portion.

2. The circuit board according to claim 1, wherein the lead frame is bent in the resin portion to form the step portion and the electrode.

3. The circuit board according to claim 1, wherein the electrode is approximately coplanar with the surface of the resin portion.

4. The circuit board according to claim 3, further comprising:
   a surface mount type electronic component mounted on the electrode by surface mounting.

5. The circuit board according to claim 4, wherein the surface mount type electronic component is mounted on the electrode with solder paste.

6. The circuit board according to claim 1, further comprising:
   a power element mounted on the electrode for conducting a large amount of current.

7. The circuit board according to claim 6, wherein the power element is mounted on the electrode with solder paste.

8. The circuit board according to claim 1, wherein the lead frame is bent to form the connector terminal.

9. A circuit board comprising:
   lead frames for supplying predetermined electric potentials respectively, each of the lead frames including at least one electrode for mounting electronic components and at least one connector terminal for connecting to at least one external circuit; and
   a resin portion in which the lead frames are encapsulated;
   wherein each of the lead frames includes at least one step portion exposed through a surface of the resin portion, the at least one electrode being formed by portions of the step portions exposed through the surface of the resin portion.

10. The circuit board according to claim 9, wherein at least one of the lead frames has a plurality of electrodes and is repeatedly bent in the resin portion to form the step portions and the plurality of electrodes.

11. The circuit board according to claim 9, wherein at least one electrode of the lead frames is approximately coplanar with the surface of the resin portion.

12. The circuit board according to claim 11, further comprising:
   a surface mount type electronic component mounted on the at least one electrode being approximately coplanar with the surface of the resin portion by surface mounting.

13. The circuit board according to claim 12, wherein the surface mount type electronic components are mounted on the at least one electrode with solder paste.

14. The circuit board according to claim 9, wherein the lead frames are bent to form the at least one connector terminal.

15. The circuit board according to claim 9, wherein the lead frames are isolated from each other by the resin portion.

* * * * *